United States Patent [19]

Abraham et al.

[11] 4,402,450

[45] Sep. 6, 1983

[54] ADAPTING CONTACTS FOR CONNECTION THERETO

[75] Inventors: Bruce C. Abraham, Limekiln; Charles R. Fegley, Laureldale, both of Pa.

[73] Assignee: Western Electric Company, Inc., New York, N.Y.

[21] Appl. No.: 295,043

[22] Filed: Aug. 21, 1981

[51] Int. Cl.³ .............................................. B23K 1/12
[52] U.S. Cl. ................................. 228/180 A; 228/170
[58] Field of Search ............... 228/170, 159, 245, 160, 228/246, 180 A, 253, 56; 29/840, 843, 591; 427/271, 272, 273

[56] References Cited

U.S. PATENT DOCUMENTS

| | | |
|---|---|---|
| 2,390,890 | 12/1945 | MacFarland . |
| 2,530,552 | 11/1950 | Stoddard . |
| 3,136,032 | 6/1964 | Berndsen . |
| 3,184,831 | 5/1965 | Siebertz . |
| 3,193,920 | 7/1965 | Culbertson et al. . |
| 3,209,449 | 10/1965 | Valentino et al. . |
| 3,292,240 | 12/1966 | McNutt et al. . |
| 3,320,658 | 5/1967 | Bolda et al. . |
| 3,465,943 | 9/1969 | Clark et al. . |
| 3,541,673 | 11/1970 | Cushman . |
| 3,676,922 | 7/1972 | Cook ....................................... 29/577 |
| 3,750,252 | 8/1973 | Landman ......................... 228/245 X |
| 3,825,999 | 7/1974 | Rubey ................................... 29/626 |
| 3,874,549 | 4/1975 | Hascoe ................................ 220/200 |
| 3,894,329 | 7/1975 | Wiemirovich ...................... 228/180 |
| 3,900,153 | 8/1975 | Beerwerth et al. ................. 228/246 |
| 3,973,718 | 8/1976 | Deschamps .......................... 228/183 |
| 4,050,621 | 9/1977 | Bouley ............................ 228/247 X |
| 4,097,266 | 6/1978 | Tasahashi et al. ................. 75/0.5 R |

FOREIGN PATENT DOCUMENTS 544846 6/1977 Japan .................................. 228/245

OTHER PUBLICATIONS

P. A. Totta et al. "SLT Device Metallurgy and Its Monolithic Extension", IBM J. Res. Develop., May 1969, pp. 226-237.

Primary Examiner—Nicholas P. Godici
Assistant Examiner—M. Jordan
Attorney, Agent, or Firm—D. C. Watson

[57] ABSTRACT

Contact pads (18) of a device (12) are adapted for bonding components such as contacts of a circuit assembly thereto. At least two of the pads (18) are interconnected with a member (34) containing bonding material. Portions of the member (34) lying adjacent the pads (18) are then removed to form isolated bodies (42) containing bonding material on the pads (18). The member (37) may be of a composite structure containing bonding material associated with a hard element (61). The bodies (42) formed therefrom contain a hard element portion (62) having dimensions which remain substantially unchanged to define a desired minimum distance between respective pads (18) and contacts when they are bonded together.

8 Claims, 7 Drawing Figures

ADAPTING CONTACTS FOR CONNECTION THERETO

TECHNICAL FIELD

This invention relates to adapting contacts for connection thereto, such as by forming bodies of bonding material on multiple contacts. More particularly, the bodies may each include a hard element portion which remains substantially dimensionally unchanged during connection thereto, providing a desired minimum distance between respective contacts.

BACKGROUND OF THE INVENTION

In industry, many and varied types of connections provide mechanical attachment as well as thermal and/or electrical conduction. Such connections are especially evident in the electronics industry where tiny packages often include a plurality of external contacts for connection to a circuit assembly. Such external contacts are becoming more densely arranged on a package and adapting them for connection has become a significant problem.

On a typical electronic package (referred to herein as a device), the contacts are disposed in rows extending along the edges of a rectangular surface. Such contacts are typically flat metal pads which are later bonded to similar contacts in a circuit assembly, e.g., a substrate such as a ceramic slab or a printed circuit (P-C) board. To prepare for such bonding, it is conventional to fuse a preformed body of bonding material to each contact on either the device or a P-C board, though more often on the device itself. Later, when the device is mounted, the array of such bodies are simultaneously heated and the material is reflowed to form mechanically sound and conductive connections between the contacts of the device and those of the P-C board.

A problem with electronic devices is that the preformed bodies are typically 10–40 mils in diameter which makes them very difficult to handle efficiently. Another problem is that the bodies are sometimes irregular in shape or out of alignment with a contact. Consequently, unwanted cross connections occur between adjacent bodies either initially or later during reflow bonding of the device to a circuit assembly. It will be appreciated that keeping connections isolated from one another is an important consideration in electronics work.

A further consideration for many such connections is that there be a defined distance between respective contacts of a device and those of a circuit assembly. For example, when a device is mounted to a P-C board, a clearance space is often required between the board and the body of the device for cleaning purposes. Conditions of heat and pressure in reflow bonding are difficult to control well enough to always achieve a well-defined distance between such contacts. To solve this problem, bodies of bonding material having a hard core are sometimes utilized. The dimensions of the core remain substantially unchanged to define a desired minimum distance between respective contacts when connection is made therebetween. However, such hard core bodies cause similar problems to those encountered with the conventional bodies. They are so small that they are difficult to handle efficiently while achieving a required isolation between bodies.

Consequently, it is desirable to provide new and improved expedients for adapting contacts for bonding other contacts thereto. It is also desirable to adapt contacts for connection to other contacts while maintaining isolation between adjacent connections. It is further desirable to adapt first contacts for connection to second contacts wherein a defined distance is maintained between respective first and second contacts.

SUMMARY OF THE INVENTION

Problems of the prior art are overcome by the instant method of adapting first contacts for bonding components such as second contacts thereto, including the steps of: interconnecting at least two of the first contacts with a member containing bonding material; and removing portions of the member adjacent the first contacts to form on each such contact an isolated body containing bonding material.

In a particular embodiment, problems have been overcome by interconnecting the first contacts with a composite member containing bonding material which is associated with a hard element in the member. Thereafter, portions of the composite member are removed adjacent the first contacts forming on each such contact an isolated composite body containing bonding material and a hard element portion. The dimensions of the hard element portion remain substantially unchanged to define a desired minimum distance between a first and a second contact when the respective contacts are bonded together.

BRIEF DESCRIPTION OF THE DRAWING

The invention will be more readily understood from the following detailed description thereof when read in conjunction with the accompanying drawing, wherein.

Figure 1:
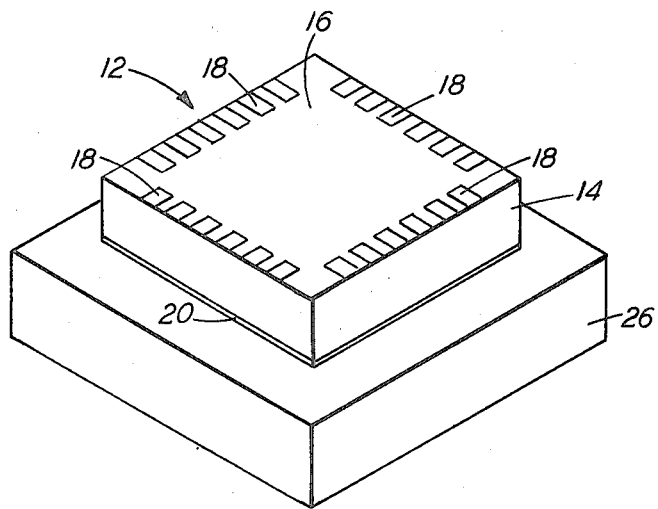
FIG. 1 is a pictorial view of a bonding stage supporting a typical device having contacts to be adapted for connection thereto.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

The Contacts

Referring to FIG. 1, a typical device is seen designated generally by the numeral 12. Although device 12 will be utilized to illustrate the practice of the invention, it should be noted that the invention is not limited to such devices. Other items in the semiconductor industry and other items in other industries contain contacts which are amenable to the practice of the invention.

Device 12 is adapted to enclose a semiconductor component (not shown) such as a monocrystalline silicon chip. Such chips are often about 150 mils square by about 20 mils in thickness and frequently contain a dense pattern of electronic elements and interconnecting circuitry. A package, such as device 12, advantageously protects such a chip from physical abuse and from external effects, such as corrosion.

Device 12 may have a plastic or ceramic body 14 which is about 400 to 500 mils square and about 100 mils high containing an internal cavity (not shown) for installing the chip therein. On a major external surface 16, an array of contacts which include flat bonding pads 18 are typically formed of a conductive and corrosion-resistant metal such as gold. The pads 18 are often very small and densely arranged. For example, the pads 18 may be about 20 mils wide by about 50 mils long and be spaced about 50 mils on center. Although an array of 24 contacts are shown on device 12, there may be many more pads of smaller dimensions on a similar device. Such pads are connected internally to the circuitry of the chip, for example, by wire bonding.

After the chip is installed in device 12 and the internal connections are made to pads 18, the cavity is usually hermetically sealed, such as by fusing a cover 20 on the body 14. Thereafter, a problem remains to prepare the pads 18 for connection to leads or contacts on a ceramic substrate or a P-C board without damage to device 12 and its contents.

Prior Art Bodies of Bonding Material

One well-known method of adapting an array of contacts for connection thereto is to apply bonding material to each contact after an item such as device 12 is completed and before it is installed. A body of bonding material is typically heat fused to a contact and often such material is then sufficiently liquefied to flow onto and be fused to a major portion of each contact. Thereafter, when an array of such contacts on a device are registered with an array of contacts in a circuit assembly, the bonding material is reflowed to wet and bond to each respective contacting surface in each array.

Figure 2:
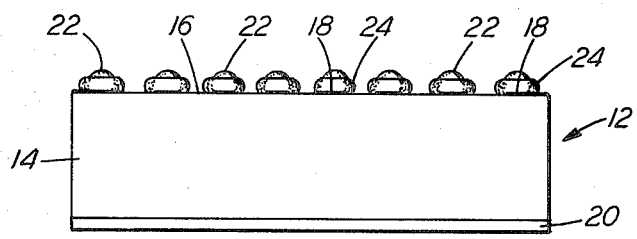
FIG. 2 is an elevation view of the typical device showing bodies of bonding material applied to the contacts in accordance with the prior art.

Referring to FIG. 2, an elevation view of a device 12 is seen after bodies 22 of bonding material have been applied to the pads 18. A typical bonding material for the illustrated example is a 60/40 solder (60% tin-40% lead) which melts at about 183° C. but which will fuse at a lower temperature under pressure. The required heat for initial fusing is typically supplied by a bonding stage 26, shown in FIG. 1. The required heat for reflowing the bonding material is supplied by an oven such as that sold by Browne Corporation of Santa Barbara, California as its Browne LR-6. The temperature and pressure utilized for fusing and reflowing should be within a range tolerated by a device 12 and its contents.

Figure 3:
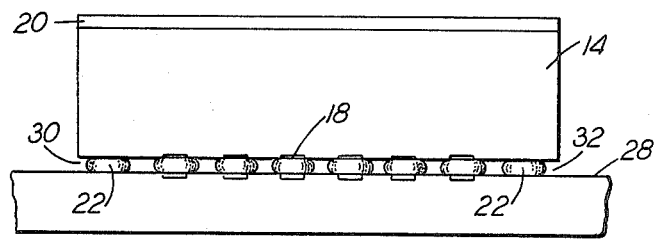
FIG. 3 is an elevation view of the typical device mounted to a substrate in accordance with the prior art.

The shape and bulk size of the bodies 22 are usually influenced by considerations of economy, efficient handling and the physical limitations extant in connecting devices to circuit assemblies. A spherical shape for the bodies 22 is typically selected because spheres are readily oriented and they are economically produced from a mass of bonding material. The bulk size of the bodies 22 are selected to adequately cover the pads 18 and to provide a desired layer thickness of bonding material between connected contacts. The layer thickness is of special consideration when a device 12 is mounted to a flat substrate 28 as shown in FIG. 3. A clearance height 30 or 32 of about 15-20 mils is desired for cleaning connected contacts and for cutting apart those that may be inadvertently cross connected.

Given the above-indicated typical dimensions of a device 12, a sphere of solder is often selected for the bodies 22 which may be about 32-40 mils in diameter. In theory such a sphere could produce a layer of solder about 17-35 mils thick on contacts which are 20 mils wide $\times$ 50 mils long. However, in practice a theoretical layer thickness is rarely obtained and uniformity among layers is not consistently achieved. As a result, heights 30 and 32 are often too low or unequal.

It will also be appreciated that handling such tiny spheres of bonding material as the bodies 22 can be a difficult problem. It has been conventional to apply preformed bodies of bonding material, initially as singular bodies, to each contact. For example, for a device 12, each pad 18 receives a singular body 22 although many such bodies may be handled by a pickup head at any one step in an operation. Sometimes a body will be missed or lost in the application of an array of bodies 22. At other times one or more bodies 22 may not fuse properly or be jarred loose from a pad 18 in handling the devices 12. If a body is not properly aligned or rolls about a pad 18 before it properly fuses, cross connections between contacts can occur. Many such problems associated with applying ones of the bodies 22 to each pad 18 are discussed in a copending patent application, Ser. No. 287971, filed on or about July 29, 1981, which is assigned to the assignee of the instant application.

Interconnecting Contacts with Bonding Material

A root cause of some of the above problems can be understood by reference again to FIGS. 1-3. It can be seen that the spherical bodies 22 do not have an optimum shape for covering the pads 18 with bonding material. Such bodies 22 have an initial diameter which is almost twice the width of contacts 18 to provide an adequate amount of bonding material to cover the pads 18 during reflow. Furthermore, the width of the bodies 22, and therefore the portions overhanging the pads 18, is increased during their application to the pads. It is evident from an annular tooling mark 24 that pressure applied to fuse the bodies 22 to the pads 18 causes the bodies to deform, the overall shape resembling an oblate spheroid. Consequently, any misalignment of spheres invites cross connection with adjacent bodies 22. Moreover, one must depend upon optimum conditions for surface tension along the pads 18 to properly distribute the bonding material during reflow over such pads.

Figure 4:
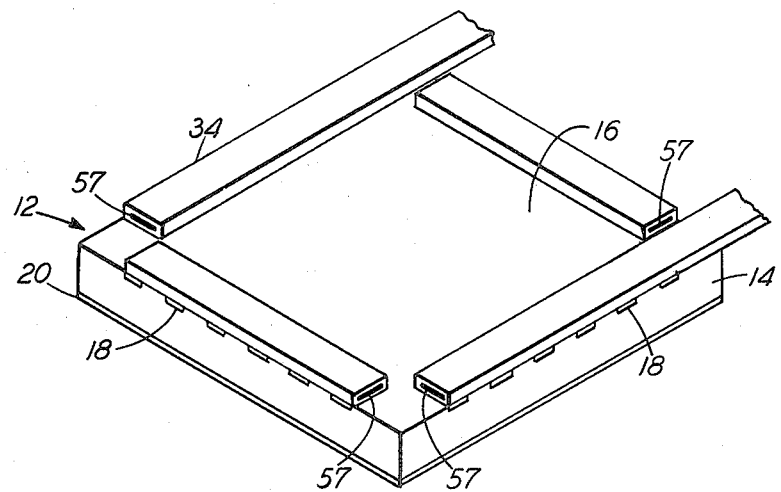
FIG. 4 is a pictorial view of the typical device showing composite members interconnecting contacts thereon in the practice of the instant invention.
Figure 5:
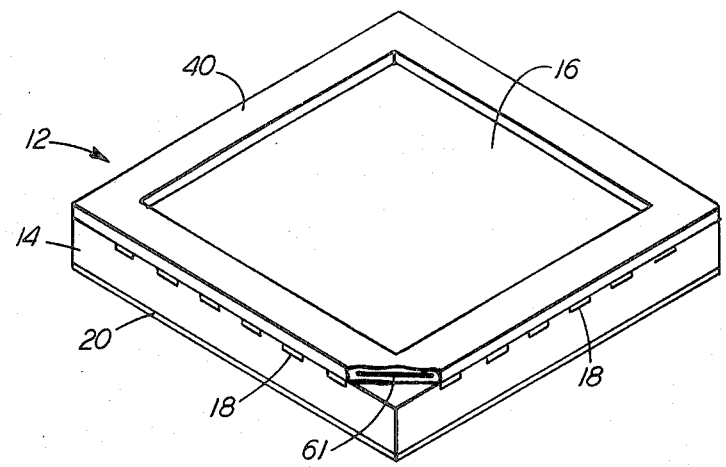
FIG. 5 is the same view as FIG. 4 except that the members comprise a composite frame.

To apply adequate, uniform and isolated bodies of bonding material to contacts, new and improved expedients are provided by the instant invention as shown in FIGS. 4 and 5. More massive members containing bonding material are shown designated by the numerals 34 and 40.

For the illustrative device 12, members 34 or 40 may be composed entirely of 60/40 solder and be formed about 15-20 mils thick by 50 mils wide to fully cover contact pads 18. Member 34 may be supplied in lengths suitable for handling and for interconnecting at least two contacts 18. In the alternate embodiment, shown in FIG. 5, the member 40 is a frame shaped to interconnect all contacts 18 in the array shown on device 12. The members 34 or 40 may be cast, extruded, cut from sheet or formed by any other technique known in the art.

In applying members 34 or 40 to typical contacts many versatile techniques are available, each having advantages in the work. For example, a member 34 need be fused to only two contact pads 18 in a row to hold it firmly in place. A frame member 40 need only be fused to two contacts in an array of contacts to hold it firmly. Such members are also large enough to be handled well manually or by automatic equipment.

Attaching the members 34 or 40 to pads 18 may initially be done by tack bonding and later by partial reflow in an oven. For example, tack fusing may be done by pin shaped probes which pressure pinpoint portions of a flat solder member to a contact pad and either the probes or the contacts or both may be heated. Also, if fusing is inappropriate, either member 34 or 40 may be mechanically restrained over the contacts prior to reflow bonding to the pads 18. It will be appreciated that flat members 34 or 40 are less likely to roll off the pads 18 than are the spherical bodies 22 of the prior art.

Fluxing to remove dirt and oxides on contacts is also facilitated by utilizing members 34 or 40 in the practice of the invention. For example, the members may be dipped in liquid flux and/or the pads 18 may be treated with flux before the members are applied to the pads 18. The flux will not readily drain from a flat member 34 or 40 and such members adequately cover flux-wetted contacts to mitigate evaporation of flux therefrom. Errant dirt on contact pads 18 is tolerated by utilizing members 34 and 40 because solder is fully distributed without depending upon surface tension for such distribution.

Removing Portions to Isolate Bodies

In the prior art, accurate placement and adherence of the spherical bodies 22 was relied upon for assuring isolation of such bodies from each other. Such placement had to be carefully maintained during fusing, handling and later connection to a circuit assembly, not an easy task with spherical bodies.

In the practice of the invention, isolated bodies of bonding material are formed after members 34 or 40 are applied to a device 12. The portions of such members adjacent the pads 18 are removed by any convenient means to acquire the condition shown in FIG. 6. For example, such portions may be saw cut, stamped out or cut with a die. An advantageous method of removal is to use a slightly thicker member 34 or 40 than that previously described so that not all the material covering a pad 18 is needed. Then a stamp or a die can cut against the metal of the pads 18 to isolate bodies 42 thereon. In another embodiment a tool may be employed to heat fuse members 34 or 40 to pads 18 while simultaneously cutting against the pads 18 or the major surface 16 of a device 12. Of course the bonding material removed in the isolating step is typically reusable by melting and reforming the same into members 34 or 40. It is evident that positive isolation of electrical and/or thermal conducting paths is thereby facilitated in the practice of the invention.

Other Alternate Embodiments

Figure 7:
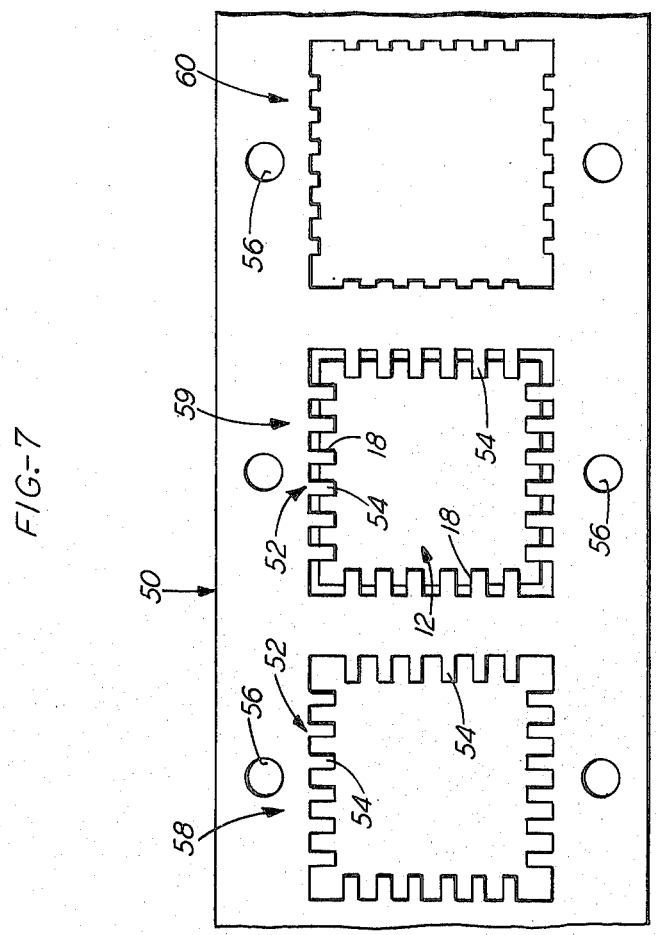
FIG. 7 is a bottom view of a lead frame assembly for adapting contacts for connection thereto.

Referring to FIG. 7, there is shown a technique for adapting contacts for connection therto which incorporates many features of a well known "lead frame" technique for assembling semiconductor devices. A strip 50 is formed from a sheet of bonding material having a thickness corresponding to a layer of bonding material desired on contacts such as the pads 18 of a device 12. A succession of arrays 52 of tabs 54 are formed in the strip 50 at regular intervals. Such arrays 52 may be accompanied by locating holes 56 for precise registration of the tabs 54 to contact pads 18 on a device 12. The arrays 52 may also be accompanied by sprocket holes (not shown) to drive the strip 50.

FIG. 7 is a bottom view which shows that the array 52 of tabs 54 correspond to the array of contact pads 18 on the typical device 12 described previously. The tabs 54 and the holes 56 may be formed by cutting, stamping, etching or any suitable method for forming patterns in sheet material.

In operation of the embodiment, shown in FIG. 7, an array 52 of tabs 54 is formed in the sheet of bonding material at position 58 as the strip 50 indexes to the right in the figure. Next at position 59, a device 12 is attached to the strip 50 by bonding an array of contact pads 18 on the device 12 to the array 52 of tabs 54 in the strip 50. Then at position 60 there is detached from the strip 50, the device 12 with the tabs 54 bonded thereto. Thereafter such tabs provide material for reflow bonding of the contacts of the device to other contacts in a circuit assembly.

It has been mentioned above that conditions of heat and pressure in reflow bonding are difficult to control well enough to always achieve a well-defined distance between respective contacts in a connection. In the prior art, spherical bodies of bonding material often had a spherical core of hard material. The dimensions of the hard core remained substantially unchanged to provide a desired minimum distance between respective contacts when they were connected. A problem with the spherical hard cores was that they rapidly shed a coating of bonding material when heated. Also the hard core bodies were so small that they were difficult to handle efficiently while achieving a required isolation between bodies.

Figure 6:
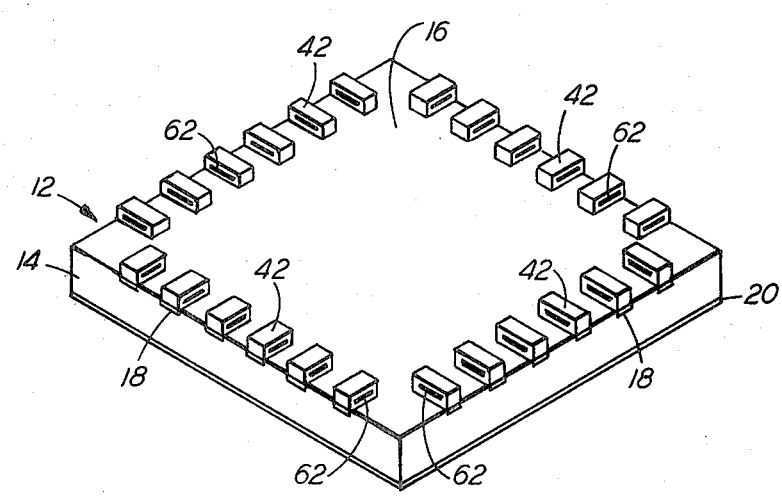
FIG. 6 is a pictorial view of the typical device showing attached to the contacts, isolated bodies containing bonding material formed according to the instant invention.

To solve the above problems, the members 34 and 40 may be composite members and may include a hard element 57 or 61 as shown in FIGS. 4 and 5. Elements 57 and 61 are associated with the composite members 34 and 40, respectively, so that isolated bodies 42, as shown in FIG. 6, are also of a composite structure each including a hard element portion 62. Such element portions 62 remain substantially unchanged without deformation at conditions required for bonding contacts of a device to contacts in a circuit assembly. Consequently, the dimensions of the hard element portions 62 define a desired minimum distance between respective contacts upon connection thereof.

In another embodiment utilizing a lead frame technique, a strip such as strip 50 may have a composite structure containing bonding material uniformly distributed over a sheet of hard element. The tabs formed therefrom will contain a hard element portion having the same properties and performing the same functions as the hard element portions 62 shown in FIG. 6.

Practical embodiments of the instant invention have been described and illustrated herein. Yet it is to be understood that various modifications and refinements may be utilized which digress from these disclosed embodiments without departing from the spirit and scope of the present invention.

For example, the members 34 and 40 have been described as having uniform cross sectional structures throughout their length. However, in other embodiments such members may comprise a succession of body portions corresponding to contact configurations with thin strips interconnecting the bodies. Such strips may be readily removed during or after the step of adhering the body portions to the contacts. For example, the strips may be comprised only of the hard element which may be severed from the bodies after they are adhered to the contacts. Conversely, the strips may be comprised only of bonding material of such a thickness and thermal sensitivity that the strips will sever by ambient heat and tension when the bodies are adhered to the contacts.

In another embodiment, at least two contacts in an array need not lie in a plane common to the contacts to be adapted for connection thereto. A member containing bonding material may be configured to interconnect contacts lying in a three-dimensional meandering path in the practice of the invention.

It is also believed evident that members interconnecting contacts need not be of any special cross section such as the rectangular cross sections of members 34 and 40. For contacts having non-planar bonding sites, e.g., curved sites, it may be more appropriate to form interconnecting members in a cylinder or other configuration conforming to the topography of the bonding sites. These and other examples demonstrate that the invention is versatile enough to adapt to many and different arrays of contacts for connection thereto.

What is claimed is:

1. A method of adapting first contacts for bonding components such as second contacts thereto, comprising:
   interconnecting at least two of the first contacts with a member containing bonding material; and
   removing portions of the member adjacent the first contacts thereby forming on each such contact an isolated body containing bonding material.

2. A method as in claim 1, wherein the member is of a composite structure including bonding material associated with a hard element and wherein the removing step further comprises:
   forming on each contact an isolated composite body containing bonding material and a hard element portion, the dimensions of said hard element portion remaining substantially unchanged to define a desired minimum distance between a first and a second contact when said respective contacts are bonded together.

3. A method as in claim 2, wherein the first contacts include flat bonding sites disposed along a row in a plane common to the flat sites and the interconnecting step further comprises:
   extending along and connecting to each site in the row the composite member, said member having an elongate structure wherein the hard element is of substantially uniform cross-section associated with bonding material uniformly distributed along the length of said member.

4. A method as in claim 3, further comprising:
   selecting the site material to include a solderable metal, the hard element to include the metal copper and the bonding material to include a conductive solder which is readily fused to the sites, to the hard element and to said second contacts.

5. A method of mounting a device to a substrate, comprising:
   interconnecting at least two contacts on the device with a composite member containing bonding material and a hard element, the dimensions of said element remaining substantially unchanged at conditions suitable for attaching by the bonding material, the contacts of the device to contacts of the substrate; and
   removing portions of the composite member adjacent the contacts of the device thereby forming isolated bodies of the composite member upon said contacts.

6. A method as in claim 5, further comprising:
   registering the contacts of the device to corresponding contacts on the substrate, the composite bodies being disposed therebetween; and
   bonding with the composite bodies, the contacts of the device to the contacts of the substrate, whereupon the dimensions of hard element portions of the respective composite bodies provide a desired minimum distance between the contacts of the device and the contacts of the substrate.

7. A method of adapting an array of contacts on a device for connection thereto, comprising:
   forming from a sheet of bonding material at least one array of tabs having free ends projecting generally toward the center of the array and opposite ends fixed to the sheet, said array of tabs corresponding to the array of contacts on the device;
   attaching the device to the sheet by bonding the array of contacts on the device to the array of tabs in the sheet; and
   detaching from the sheet the device with the tabs bonded thereto such that the tabs provide material for later reflow bonding of the contacts of the device to contacts of an assembly.

8. A method as in claim 7, wherein the sheet is of a composite structure containing bonding material uniformly distributed over a sheet of hard element and wherein forming an array of tabs further comprises:
   forming tabs having a hard element portion, the dimensions of said hard element portion remaining substantially unchanged to define a desired minimum distance between respective contacts when said contacts are connected with said hard element portion therebetween.

* * * * *